United States Patent
Hong et al.

(10) Patent No.: US 9,853,250 B2
(45) Date of Patent: Dec. 26, 2017

(54) ORGANIC LIGHT-EMITTING DISPLAY DEVICES AND METHODS OF MANUFACTURING ORGANIC LIGHT-EMITTING DISPLAY DEVICES

(71) Applicant: Samsung Display Co., Ltd., Yongin-si, Gyeonggi-do (KR)

(72) Inventors: Sang-Mok Hong, Asan-si (KR); Jung-Hwa Kim, Gunpo-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/178,342

(22) Filed: Jun. 9, 2016

(65) Prior Publication Data

US 2017/0054102 A1    Feb. 23, 2017

(30) Foreign Application Priority Data

Aug. 17, 2015  (KR) .................. 10-2015-0115625

(51) Int. Cl.
*H01L 51/52*       (2006.01)
*H01L 27/32*       (2006.01)
*H01L 51/56*       (2006.01)

(52) U.S. Cl.
CPC ........ *H01L 51/529* (2013.01); *H01L 27/3211* (2013.01); *H01L 27/3262* (2013.01);
(Continued)

(58) Field of Classification Search
CPC ... H01L 51/52; H01L 51/529; H01L 51/5256; H01L 27/3262; H01L 27/3276
See application file for complete search history.

(56) References Cited

U.S. PATENT DOCUMENTS

2006/0113900 A1* 6/2006 Oh ...................... H01L 27/3276
                                                                       313/504
2011/0272714 A1* 11/2011 Lhee .................. H01L 51/5246
                                                                          257/88
(Continued)

FOREIGN PATENT DOCUMENTS

KR    10-2009-0128888 A    12/2009
KR    10-2013-0007003 A      1/2013
(Continued)

*Primary Examiner* — Phuc Dang
(74) *Attorney, Agent, or Firm* — Knobbe Martens Olson & Bear LLP

(57) ABSTRACT

An organic light-emitting display (OLED) device is disclosed. In one aspect, the OLED device includes a substrate including a display region and a peripheral region and a transistor disposed in the display region and including an active pattern, a gate insulation layer, a gate electrode, a source electrode, and a drain electrode. The OLED device also includes an organic light-emitting structure disposed in the display region and electrically connected to the transistor, the organic light-emitting structure including a first electrode, an organic light-emitting layer, and a second electrode, and a first wiring and a second wiring disposed in the peripheral region and configured to generate heat. The OLED device further includes an encapsulation layer disposed over the first and second wirings and the organic light-emitting structure and a heat blocking layer disposed between the first and the second wirings and the encapsulation layer to block the heat generated from the first and the second wirings.

18 Claims, 11 Drawing Sheets

(52) U.S. Cl.
CPC ...... *H01L 27/3276* (2013.01); *H01L 51/5256* (2013.01); *H01L 51/56* (2013.01)

(56) References Cited

U.S. PATENT DOCUMENTS

| | | | |
|---|---|---|---|
| 2012/0090664 A1* | 4/2012 | Yamaguchi | H01L 31/022466 136/249 |
| 2015/0115234 A1* | 4/2015 | Hong | H01L 51/525 257/40 |
| 2015/0144912 A1* | 5/2015 | Park | H01L 51/5256 257/40 |
| 2015/0144977 A1* | 5/2015 | Odaka | H01L 33/44 257/98 |

FOREIGN PATENT DOCUMENTS

| | | |
|---|---|---|
| KR | 10-2015-0006125 A | 1/2015 |
| KR | 10-2015-0037134 A | 4/2015 |

\* cited by examiner

ORGANIC LIGHT-EMITTING DISPLAY DEVICES AND METHODS OF MANUFACTURING ORGANIC LIGHT-EMITTING DISPLAY DEVICES

CROSS-REFERENCE TO RELATED APPLICATION(S)

This application claims priority under 35 USC §119 to Korean Patent Application No. 10-2015-0115625, filed on Aug. 17, 2015 in the Korean Intellectual Property Office (KIPO), the entire disclosure of which is incorporated by reference herein.

BACKGROUND

Field

The described technology generally relates to organic light-emitting display (OLED) devices and methods of manufacturing OLED devices.

Description of the Related Technology

An OLED device has an organic light-emitting structure including a hole injection layer, an electron injection layer, and an interposed organic emission layer which form a matrix of pixels. In an OLED device, light is generated as excitons, when holes injected from the hole injection layer and electrons injected from the electron injection layer are combined and fall from an excited state to a ground state. OLED devices do not require a separate light source, and thus they have desirable characteristics including a thin profile, a light weight, low power consumption, a wide viewing angle, high contrast, and high response speed.

However, the display panel integrity is compromised when water vapor or oxygen infiltrates the organic light-emitting structure. Therefore, an encapsulation member is generally required to protect the organic light-emitting structure from ambient environmental conditions. Recently, a flexible encapsulation layer has been used as the encapsulation member for the organic light-emitting structure in keeping with the organic light-emitting structure being thin and flexible.

In an OLED device manufacturing process, an aging process is typically performed to remove dark defects, to increase useful life, and to maintain white balance of the device. For aging, high voltage can often be applied to OLED wirings, and a substantial amount of heat may arise due to electrical resistance of the wirings. When this heat is transferred to the encapsulation layer, it can be burned or otherwise heat damaged.

SUMMARY OF CERTAIN INVENTIVE ASPECTS

One inventive aspect relates to an OLED device including a heat blocking layer that can block heat generated from wirings.

Another aspect is a method of manufacturing the OLED device.

Another aspect is an OLED device that includes a substrate having a display region and a peripheral region, a transistor disposed in the display region, an organic light-emitting structure disposed in the display region, a first wiring and a second wiring disposed in the peripheral region, an encapsulation layer disposed on the first wiring, the second wiring, and the organic light-emitting structure, and a heat blocking layer disposed between the first and the second wirings, and the encapsulation layer. The transistor may include an active pattern, a gate insulation layer, a gate electrode, a source electrode, and a drain electrode. The organic light-emitting structure may be electrically connected to the transistor. The organic light-emitting structure may include a first electrode, an organic light-emitting layer, and a second electrode. The heat blocking layer may block heat generated from the first and the second wirings.

The first wiring and the second wiring may be disposed at the same level over the substrate.

Each of the first and the second wirings may transfer an aging signal to a pixel of the OLED device.

The first wiring may transfer a red data signal or a blue data signal to a pixel of the OLED device, and the second wiring may transfer a green data signal to a pixel of the OLED device.

Each of the first and the second wirings may include molybdenum (Mo) and/or titanium (Ti).

The encapsulation layer may include at least one organic film and at least one inorganic film.

The encapsulation layer may have a stacked structure including a first inorganic film, an organic film, and a second inorganic film.

The heat blocking layer may include silver (Ag) and/or indium tin oxide (ITO).

The first wiring, the second wiring, and the gate electrode may be disposed at the same level over the substrate.

The heat blocking layer and the first electrode may be disposed at the same level over the substrate.

The OLED device may further include an additional insulation layer disposed on the first and the second wirings in the peripheral region, and a third wiring disposed on the additional insulation layer.

The additional insulation layer may have a contact hole exposing the second wiring, and the third wiring may be in contact with the second wiring through the contact hole.

The third wiring may include aluminum (Al) and/or copper (Cu).

The third wiring may have a resistance less than that of the second wiring.

The third wiring, the source electrode, and the drain electrode may be disposed at the same level over the substrate.

Another aspect is a method of manufacturing an OLED device, a substrate having a display region and a peripheral region may be provided, and then a transistor including an active pattern, a gate insulation layer, a gate electrode, a source electrode, and a drain electrode may be formed in the display region. An organic light-emitting structure electrically connected to the transistor and including a first electrode, an organic light-emitting layer, and a second electrode may be formed in the display region. A first wiring and a second wiring may be formed in the peripheral region, and then a heat blocking layer may be formed in the peripheral region to cover the first and the second wirings. An encapsulation layer may be formed on the heat blocking layer and the organic light-emitting structure.

The first wiring, the second wiring, and the gate electrode may be simultaneously formed.

The heat blocking layer and the first electrode may be simultaneously formed.

An additional insulation layer may be formed on the first and the second wirings in the peripheral region. The additional insulation layer may be partially removed to form a contact hole exposing the second wiring, and then a third wiring filling the contact hole may be formed on the additional insulation layer. Here, the third wiring, the source electrode, and the drain electrode may be simultaneously formed.

According to at least one of the disclosed embodiments, heat generated from first and the second wirings can be substantially blocked before it reaches the encapsulation layer. Further, the OLED device may include a third wiring having a relatively low electrical resistance and electrically connected to the second wiring, so that the heat generated from the second wiring may decrease due to a reduced electrical resistance of the second wiring. Therefore, a burning on the encapsulation layer can be minimized or prevented.

Another aspect is an organic light-emitting display (OLED) device, comprising: a substrate having a display region and a peripheral region; a transistor disposed in the display region, the transistor including an active pattern, a gate insulation layer, a gate electrode, a source electrode, and a drain electrode; an organic light-emitting structure disposed in the display region and electrically connected to the transistor, the organic light-emitting structure including a first electrode, an organic light-emitting layer, and a second electrode; a first wiring and a second wiring disposed in the peripheral region; an encapsulation layer disposed over the first and second wirings and the organic light-emitting structure; and a heat blocking layer disposed between the first and the second wirings and the encapsulation layer to block heat generated from the first and the second wirings.

In the above OLED device, the first and second wirings are disposed on the same layer. In the above OLED device, each of the first and the second wirings is configured to transfer an aging signal to a pixel of the OLED device. In the above OLED device, the first wiring is configured to transfer a red data signal or a blue data signal to a pixel of the OLED device, and wherein the second wiring is configured to transfer a green data signal to a pixel of the OLED device. In the above OLED device, each of the first and the second wirings includes at least one of molybdenum (Mo) and titanium (Ti).

In the above OLED device, the encapsulation layer includes at least one organic film and at least one inorganic film. In the above OLED device, the encapsulation layer has a stacked structure including a first inorganic film, an organic film, and a second inorganic film. In the above OLED device, the heat blocking layer includes at least one of silver (Ag) and indium tin oxide (ITO). In the above OLED device, the first and second wirings and the gate electrode are disposed on the same layer.

In the above OLED device, the heat blocking layer and the first electrode are disposed on the same layer. The above OLED device further comprises: an additional insulation layer disposed over the first and the second wirings in the peripheral region; and a third wiring disposed over the additional insulation layer. In the above OLED device, the additional insulation layer has a contact hole exposing the second wiring, and wherein the third wiring contacts the second wiring through the contact hole. In the above OLED device, the third wiring includes at least one of aluminum (Al) and copper (Cu). In the above OLED device, the third wiring has a resistance less than that of the second wiring. In the above OLED device, the third wiring, the source electrode, and the drain electrode are disposed on the same layer.

Another aspect is a method of manufacturing an organic light-emitting display (OLED) device, comprising: providing a substrate including a display region and a peripheral region; forming a transistor in the display region, the transistor including an active pattern, a gate insulation layer, a gate electrode, a source electrode, and a drain electrode; forming an organic light-emitting structure in the display region, the organic light-emitting structure being electrically connected to the transistor and including a first electrode, an organic light-emitting layer, and a second electrode; forming a first wiring and a second wiring in the peripheral region; forming a heat blocking layer to cover the first and the second wirings in the peripheral region; and forming an encapsulation layer over the heat blocking layer and the organic light-emitting structure.

In the above method, the first and second wirings and the gate electrode are simultaneously formed. In the above method, the heat blocking layer and the first electrode are simultaneously formed. The above method further comprises: forming an additional insulation layer over the first and the second wirings in the peripheral region; partially removing the additional insulation layer to form a contact hole exposing the second wiring; and forming a third wiring over the additional insulation layer while filling the contact hole. In the above method, the third wiring, the source electrode, and the drain electrode are simultaneously formed.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF CERTAIN INVENTIVE EMBODIMENTS

Hereinafter, OLED devices and methods of manufacturing OLED devices in accordance with example embodiments will be explained in detail with reference to the accompanying drawings.

Figure 1:
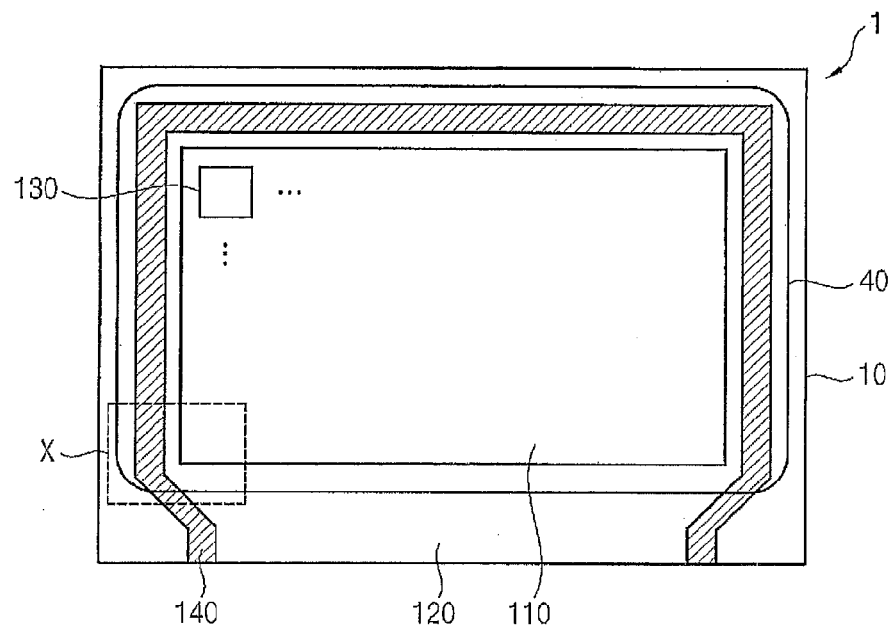
FIG. 1 is a plan view illustrating an OLED device in accordance with example embodiments.
Figure 2:
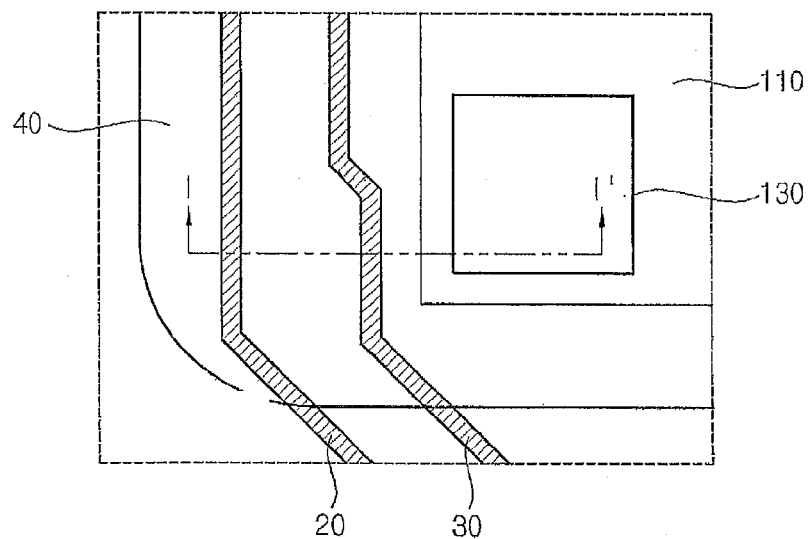
FIG. 2 is a plan view illustrating an 'X' portion of the OLED device in FIG. 1 in accordance with example embodiments.
Figure 3:
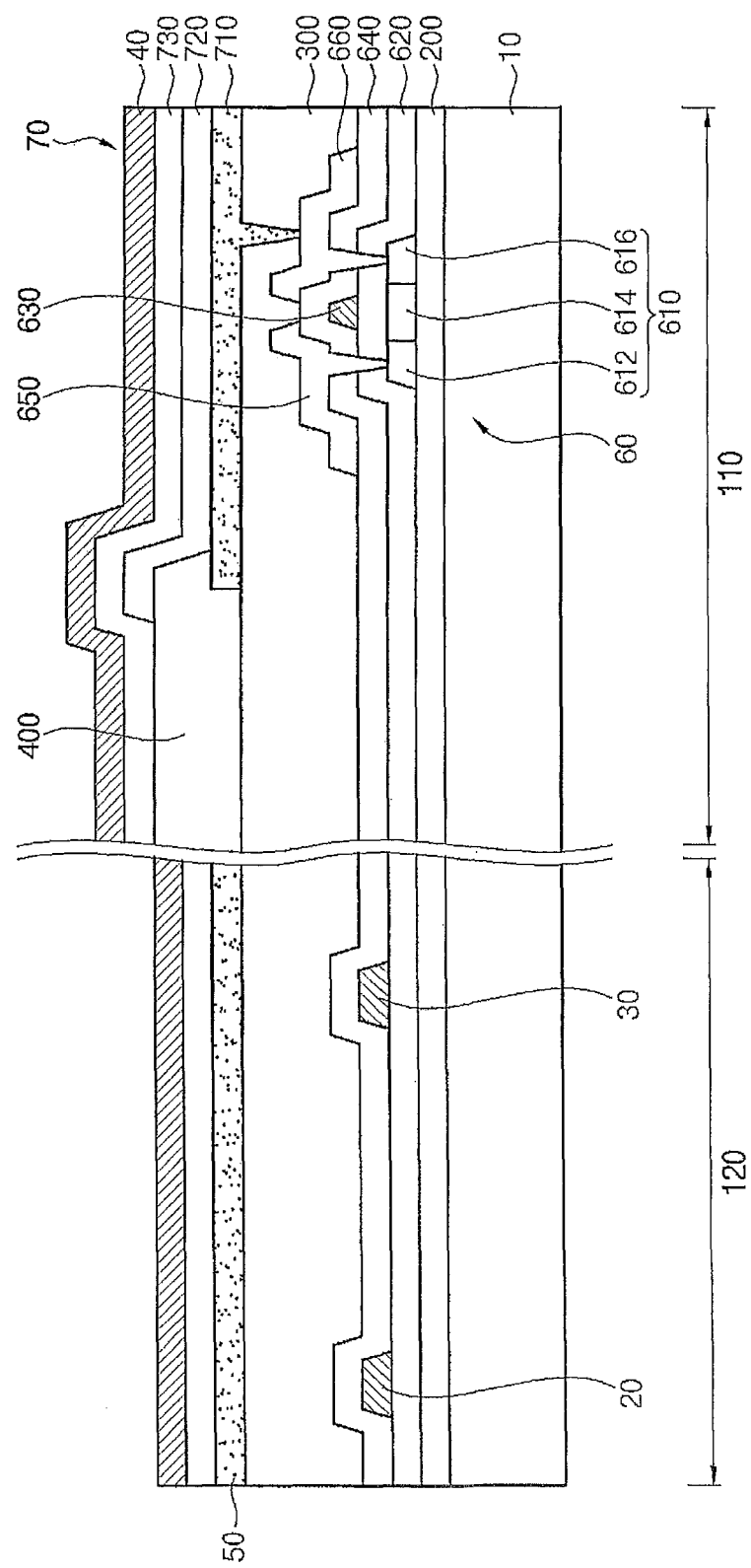
FIG. 3 is a cross-sectional view illustrating the OLED device taken along a line I-I' in FIG. 2.

FIG. 1 is a plan view illustrating an OLED device 1 in accordance with example embodiments. FIG. 2 is a plan view illustrating an 'X' portion of the OLED device 1 in FIG. 1. FIG. 3 is a cross-sectional view illustrating the OLED device 1 taken along a line I-I' in FIG. 2.

Referring to FIGS. 1 to 3, the OLED device 1 includes a substrate 10, a wiring portion 140, a transistor 60, an organic light-emitting structure 70, an encapsulation layer 40, a heat blocking layer 50, etc. In example embodiments, the wiring portion 40 includes a first wiring 20 and a second wiring 30.

The substrate 10 has a display region 110 and a peripheral region 120. For example, the substrate 10 includes a transparent insulation substrate such as a glass substrate, a quartz substrate, a plastic substrate, etc. Alternatively, the substrate 10 may be made of a flexible material.

A plurality of pixels 130 are disposed in the display region 110 for displaying images. For example, the pixels 130 are arranged as a substantial matrix structure in the display region 110. In example embodiments, the display region 110 is substantially located at the center of the substrate 10.

Driving circuits and the wiring portion 140 are disposed in the peripheral region 120 for driving the pixels 130 in the display region 110 of the substrate 10. The peripheral region 120 may substantially surround the display region 110.

The first wiring 20 and the second wiring 30 may be disposed in the peripheral region 120. As illustrated in FIG. 2, the second wiring 30 may be closer to the display region 110 than the first wiring 20. The first wiring 20 and the second wiring 30 may be disposed on the same layer or at the substantially same level over the substrate 10. For example, the first and second wirings 20 and 30 are positioned on the substantially same plane over the substrate 10.

Each of the first and the second wirings 20 and 30 may transfer an aging signal to the pixels of the OLED device 1. An aging may be referred to as the organic light-emitting structure 70 emits light during a predetermined period to accelerate an initial luminance drop of the organic light-emitting structure 70. In general, the aging may be performed before a release of the OLED device 1. When the aging signals are applied to the pixels 130 through the first and the second wirings 20 and 30, the organic light-emitting structure 70 of each pixel 130 may emit a light based on the aging signal.

In some example embodiments, the first wiring 20 transfers a red data signal or a blue data signal to the pixels of the OLED device 1, and the second wiring 30 transfers a green data signal to the pixels of the OLED device 1. For example, the first wiring 20 transfers the aging signal to red sub-pixels or blue sub-pixels, and the second wiring 30 transfers the aging signal to green sub-pixels. For example, each of the first and the second wirings 20 and 30 includes molybdenum (Mo) and/or titanium (Ti).

The encapsulation layer 40 may be disposed on the first and the second wirings 20 and 30. The encapsulation layer 40 may substantially block vapor or oxygen from an outside to protect the organic light-emitting structure 70.

In example embodiments, the encapsulation layer 40 has a stacked structure which may include at least one organic film and at least one inorganic film. For example, the encapsulation layer 40 includes two inorganic films and one organic film. Here, the organic film may be interposed between the inorganic films. The inorganic film may include aluminum oxide (AlOx), silicon oxide (SiOx), silicon nitride (SiNx), silicon oxy nitride (SiOxNy), silicon carbide (SiCx), titanium oxide (TiOx), zirconium oxide (ZrOx), and/or zinc oxide (ZnOx). The organic film may include epoxy, polyimide (PI), polyethylene terephthalate (PET), polycarbonate (PC), polyethylene (PE), and/or polyacrylate.

When each of the first and the second wirings 20 and 30 includes a metal having a relatively high resistivity, such as molybdenum and/or titanium, power consumptions of the first and the second wirings 20 and 30 may be increased, and thus a relatively high heat may be generated from the first and the second wirings 20 and 30. When the heat is transferred to the encapsulation layer 40, the encapsulation layer 40 may be burned or damaged.

The heat blocking layer 50 may be disposed between the first and the second wirings 20 and 30, and the encapsulation layer 40 to substantially cover the first and the second wirings 20 and 30 in the peripheral region 120. The heat blocking layer 50 may substantially block the heat generated from the first and the second wirings 20 and 30, so that the heat blocking layer 50 may substantially block the propagation of the heat toward the encapsulation layer 40. Therefore, the heat blocking layer 50 may prevent burning of the encapsulation layer 40 caused by the heat.

The heat blocking layer 50 may have a single layer structure or a multi-layer structure. For example, the heat blocking layer 50 includes silver (Ag) and/or indium tin oxide (ITO). Here, the heat blocking layer 50 may have the multi-layer structure including a layer of silver and a layer of indium tin oxide. Alternatively, the heat blocking layer 50 may include a layer of silver or a layer of indium tin oxide as occasion demands.

The pixel 130 in the display region 110 may include the organic light-emitting structure 70 electrically connected to the transistor 60. The organic light-emitting structure 70 may emit various colors of light for displaying the images in the display region 110.

Referring to FIG. 3, a buffer layer 200 may be disposed on the substrate 10. The buffer layer 200 may extend from the display region 110 to the peripheral region 120. The buffer layer 200 may prevent vapor or oxygen from being permeated toward upper structures including the transistor 60 and the organic light-emitting structure 70. Additionally, the buffer layer 200 may prevent diffusion of ions from the substrate 10 to the upper structures. For example, the buffer layer 200 includes a silicon compound such as silicon oxide, silicon nitride, silicon oxynitride, etc. The buffer layer 200 may have a single layer structure or a multi-layer structure.

The transistor 60 may include an active pattern 610, a gate insulation layer 620, a gate electrode 630, an insulation interlayer 640, a source electrode 650, a drain electrode 660, etc. As illustrated in FIG. 3, the transistor 60 has a top gate configuration in which the gate electrode 630 locates on a top of the active pattern 610, however, the configuration of the transistor 60 may not be limited thereto. In some example embodiments, the transistor 60 has a bottom gate configuration in which the gate electrode 630 locates under a bottom of the active pattern 610.

The active pattern 610 may be disposed on the buffer layer 200. For example, the active pattern 610 includes a material containing silicon or oxide semiconductor. The active pattern 610 may include a source region 612, a drain region 616, and a channel region 614 disposed between the source region 612 and the drain region 616.

The gate insulation layer 620 may be disposed on the buffer layer 200 to substantially cover the active pattern 610. The gate insulation layer 620 may extend from display region 110 to the peripheral region 120. For example, the gate insulation layer 620 includes a silicon compound such as silicon oxide, silicon nitride, and silicon oxy nitride, or may include metal oxide such as aluminum oxide, titanium oxide, and hafnium oxide.

The gate electrode 630 may be disposed on the gate insulation layer 620. In example embodiments, the gate electrode 630 is located on a top of the channel region 614 of the active pattern 610. For example, the gate electrode 630 includes molybdenum and/or titanium.

The first and the second wirings 20 and 30, and the gate electrode 630 may be disposed at the same level over the substrate 10. For example, the first and the second wirings 20 and 30, and the gate electrode 630 are located on the gate insulation layer 620. Here, each of the first wiring 20, the second wiring 30 and the gate electrode 630 may include the same material.

The insulation interlayer 640 may be disposed on the gate insulation layer 620 to substantially cover the gate electrode 630. The insulation interlayer 640 may electrically insulate the gate electrode 630 from the source electrode 650 and the drain electrode 660. For example, the insulation interlayer 640 includes a silicon compound such as silicon oxide, silicon nitride, silicon oxy nitride, etc.

The source electrode 650 and the drain electrode 660 may be disposed on the insulation interlayer 640. Each of the source electrode 650 and the drain electrode 660 may make contact with the active pattern 610 through the gate insulation layer 620 and the insulation interlayer 640. Specifically, the source electrode 650 may be electrically connected to the source region 612 of the active pattern 610, and the drain electrode 660 may be electrically connected to the drain region 616 of the active pattern 610. For example, each of the source electrode 650 and drain electrode 660 includes aluminum (Al) and/or copper (Cu).

The insulation layer 300 may be disposed on the insulation interlayer 640 to substantially cover the transistor 60. The insulation layer 300 may extend from the display region 110 to the peripheral region 120. The insulation layer 300 may have a substantially flat upper surface. For example, the insulation layer 300 includes a silicon compound such as silicon oxide, silicon nitride, silicon oxy nitride, etc. Alternatively, the insulation layer 300 may include an organic material such as polyimide, acryl, etc.

As illustrated in FIG. 3, the organic light-emitting structure 70 may include a first electrode 710, an organic light-emitting layer 720, a second electrode 730, etc.

The first electrode 710 may be disposed on the insulation layer 300. The first electrode 710 may be in contact with the drain electrode 660 through the insulation layer 300. Thus, the organic light-emitting structure 70 may be electrically connected to the transistor 60. For example, the first electrode 710 corresponds to an anode of the organic light-emitting structure 70. When the OLED device 1 has a top emission type, the first electrode 710 may act as a reflective electrode. On the other hand, the first electrode 710 may act as a transparent electrode in case that the OLED device 1 has a bottom emission type.

The first electrode 710 may include at least one of silver and indium tin oxide. In example embodiments, the heat blocking layer 50 and the first electrode 710 are disposed at the same level over the substrate 10. For example, the heat blocking layer 50 and the first electrode 710 are located on the insulation layer 300. Here, the heat blocking layer 50 may include a material substantially the same as that of the first electrode 710.

A pixel defining layer 400 may be disposed on the insulation layer 300 while partially exposing the first electrode 710. The pixel defining layer 400 may have a pixel opening that may expose a portion of the first electrode 710. For example, the pixel defining layer 400 includes an organic material or an inorganic material.

The organic light-emitting layer 720 may be disposed on the exposed first electrode 710 and a portion of the pixel defining layer 400. In an example embodiment, when the organic light-emitting layer 720 includes an organic material having a relatively low molecular weight, a hole injection layer and a hole transport layer may be disposed under the organic light-emitting layer 720, and an electron transport layer and an electron injection layer may be disposed on the organic light-emitting layer 720. In another example embodiment, when the organic light-emitting layer 720 includes an organic material having a relatively high molecular weight, a hole transport layer may be disposed under the organic light-emitting layer 720.

The second electrode 730 may be disposed on the organic light-emitting layer 720. The second electrode 730 may extend from the display region 110 to the peripheral region 120. For example, the second electrode 730 corresponds to a cathode of the organic light-emitting structure 70. When the OLED device 1 is a top emission type OLED device, the second electrode 730 may act as the transparent electrode. On the other hand, when the OLED device 1 is a bottom emission type OLED device, the second electrode 730 may act as the reflective electrode. For example, the second electrode 730 includes at least one of silver and indium tin oxide.

As described above, the OLED device 1 may include the heat blocking layer 50 disposed between the first and the second wirings 20 and 30, and the encapsulation layer 40, and thus the heat blocking layer 50 may prevent heat generated from the first and the second wirings 20 and 30 from transferring to the encapsulation layer 40. Therefore, a burning on the encapsulation layer 40 by the heat generated from the first and the second wirings 20 and 30 may be prevented.

Figure 4:
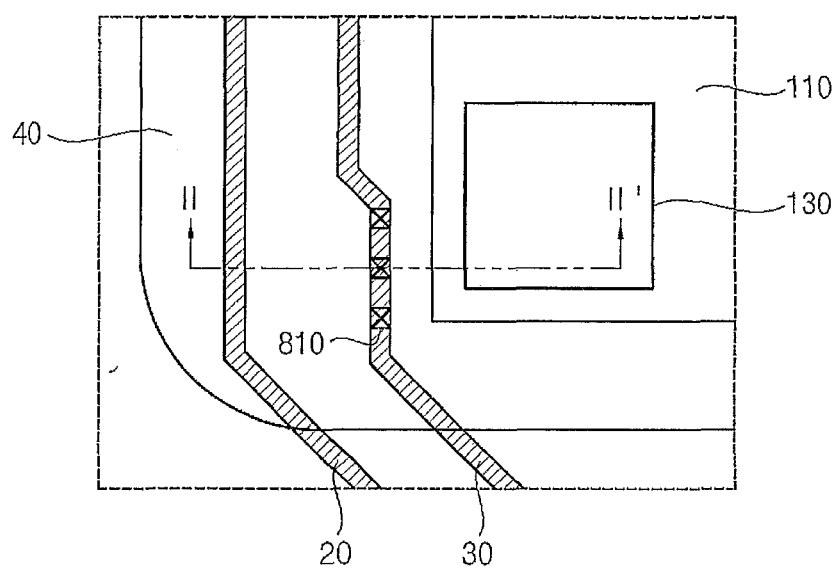
FIG. 4 is a plan view illustrating an 'X' portion of the OLED device in FIG. 1 in accordance with some example embodiments.
Figure 5:
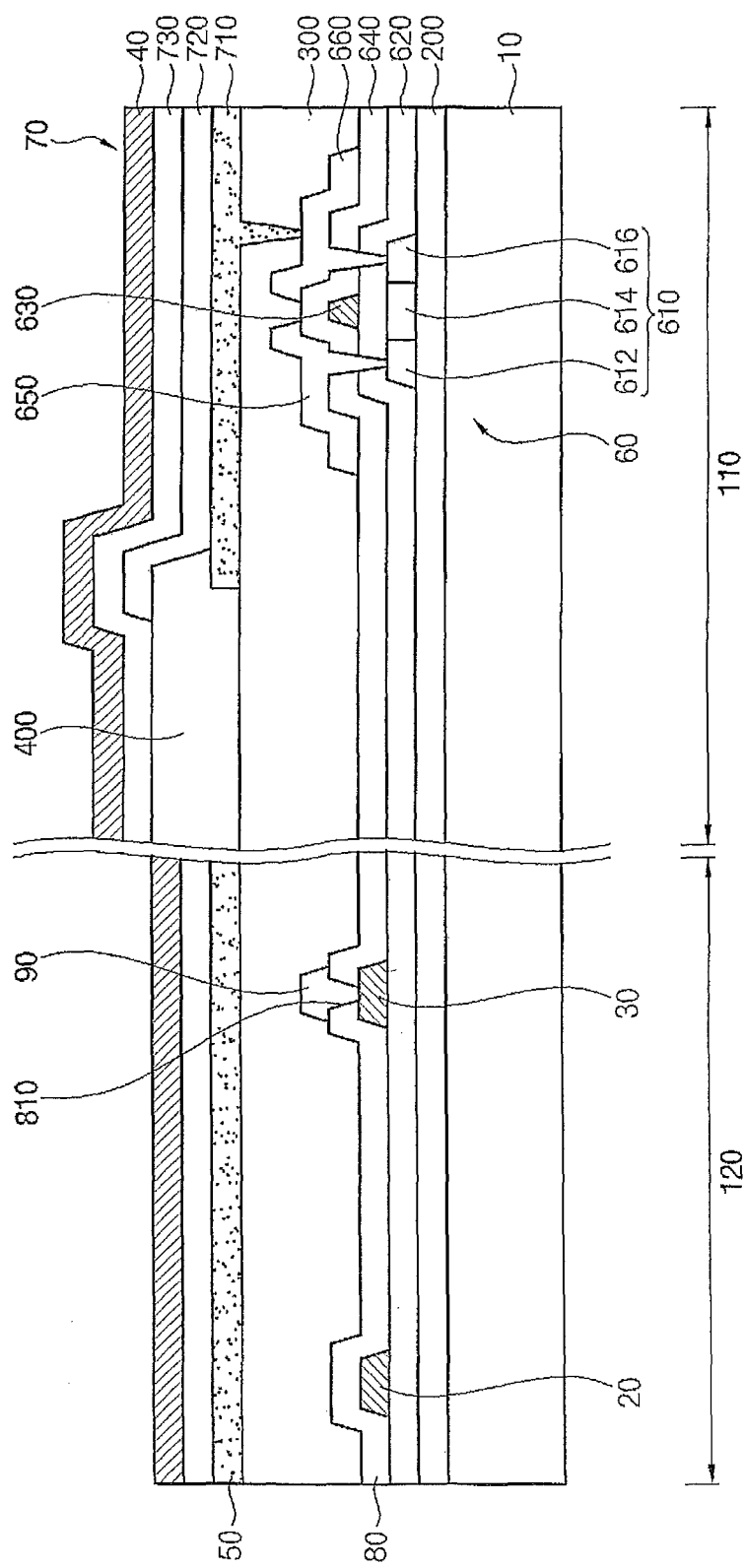
FIG. 5 is a cross-sectional view illustrating the OLED device taken along a line II-IF in FIG. 4.

FIG. 4 is a plan view illustrating an 'X' portion of the OLED device in FIG. 1 in accordance with some example embodiments. FIG. 5 is a cross-sectional view illustrating the OLED device taken along a line II-II' in FIG. 4.

Referring to FIGS. 4 and 5, an OLED device 1 may include a substrate 10, a wiring portion 140, a transistor 60, an organic light-emitting structure 70, an encapsulation layer 40, a heat blocking layer 50, an additional insulation layer 80, etc. The wiring portion 140 may have a first wiring 20, a second wiring 30, and a third wiring 90. Detailed description about elements illustrated in FIGS. 4 and 5 which are substantially the same as or similar to those illustrated with reference to FIGS. 2 and 3 will be omitted.

The additional insulation layer 80 may be disposed on the gate insulation layer 620 to substantially cover the first and the second wirings 20 and 30 in the peripheral region 120. For example, the additional insulation layer 80 includes a silicon compound such as silicon oxide, silicon nitride, silicon oxy nitride, etc.

The additional insulation layer 80 may correspond to the insulation interlayer 640. For example, the insulation interlayer 640 extends from the display region 110 to the peripheral region 120, and serves as the additional insulation layer 80 covering the first and the second wirings 20 and 30 in the peripheral region 120.

The third wiring 90 may be disposed on the additional insulation layer 80 in the peripheral region 120. In example embodiments, the third wiring 90 substantially overlaps the second wiring 30. For example, the third wiring 90 includes at least one of aluminum (Al) and copper (Cu).

Electrical resistance of the third wiring 90 may be less than that of the second wiring 30. For example, the third wiring 90 has a resistivity substantially less than that of the second wiring 30.

The third wiring 90, and the source electrode 650 and the drain electrode 660 of the transistor 60 may be disposed at the same level over the substrate 10. For example, the third wiring 90, the source electrode 650, and the drain electrode 660 are located on the insulation interlayer 640 that corresponds to the additional insulation layer 80. Here, the third wiring 90, the source electrode 650, and the drain electrode 660 may include the same metal.

A contact hole 810 that partially exposes the second wiring 30 may be formed on the additional insulation layer 80 in the peripheral region 120. The third wiring 90 may fill the contact hole 810, and thus may be in contact with the second wiring 30. Therefore, the electrical resistance of the second wiring 30 may decrease.

As described above, the OLED device 1 may include the third wiring 90 that has relatively low electrical resistance, and the third wiring 90 may be in contact with the second wiring 30 through the contact hole 810. Therefore, the electrical resistance of the second wiring 30 may decrease, and thus heat generated from the second wiring 30 may decrease. In other words, the heat generated from the first and the second wirings 20 and 30 may decrease due to the third wiring 30.

FIGS. 6 to 9 are cross-sectional views illustrating a method of manufacturing the OLED device in accordance with example embodiments.

Figure 6:
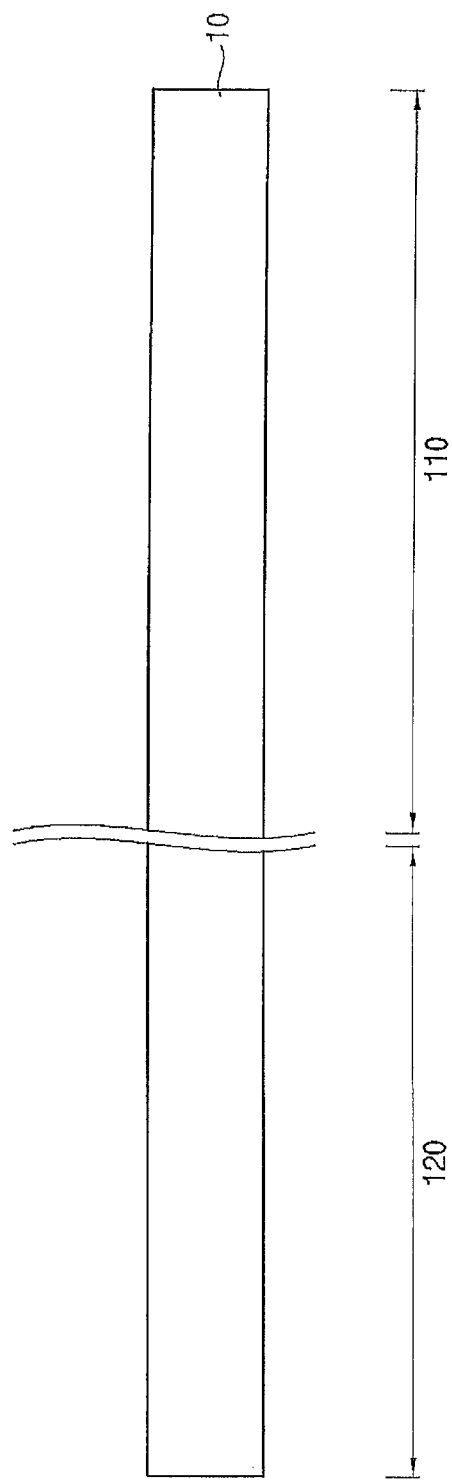
FIGS. 6 to 9 are cross-sectional views illustrating a method of manufacturing the OLED device in accordance with example embodiments.

Referring to FIG. 6, a substrate 10 having a display region 110 and a peripheral region 120 may be provided. As described with reference to FIG. 1, a plurality of pixels may be formed in the display region 110 to display images. Driving circuits and wirings may be disposed in the peripheral region 120 to drive the pixels.

Figure 7:
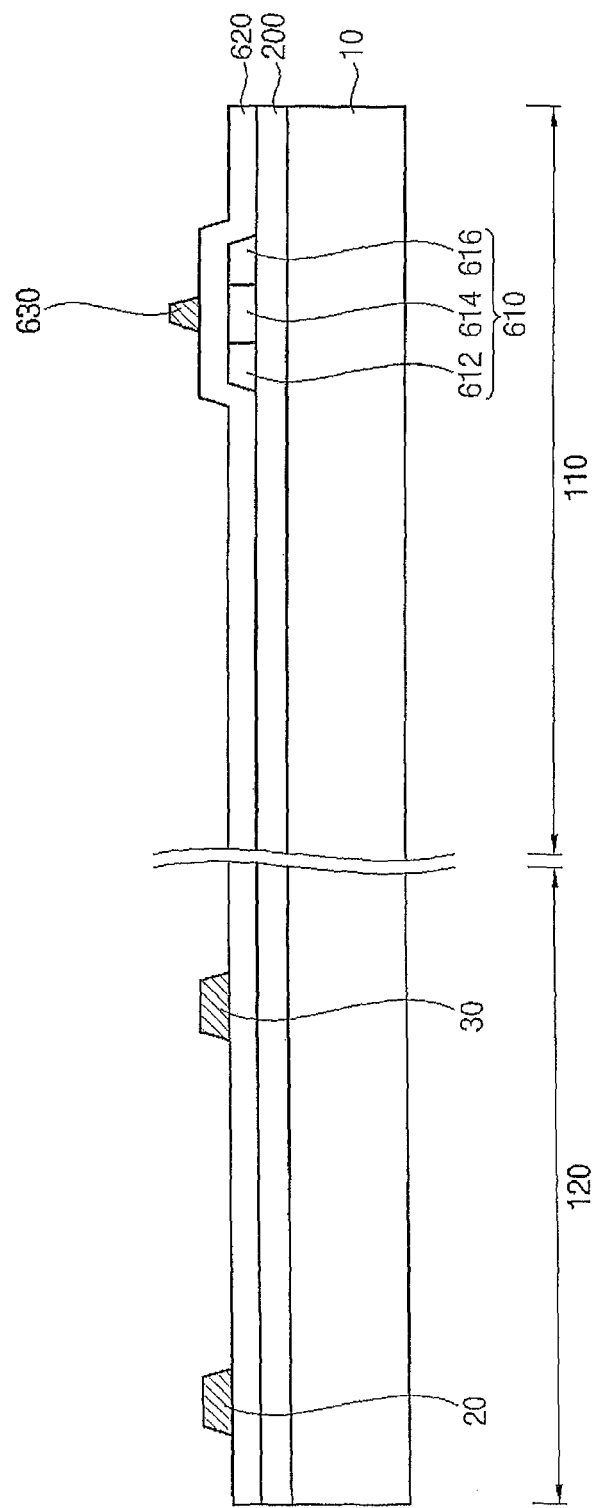

Referring to FIG. 7, a buffer layer 200 may be formed on the substrate 10. For example, the buffer layer 200 is formed by a deposition process or a coating process using a silicon compound such as silicon oxide, silicon nitride, silicon oxy nitride, etc. The buffer layer 200 may be formed in the display region 110 and the peripheral region 120 as a single layer structure or a multi-layer structure.

A semiconductor layer may be formed on the buffer layer 200. The semiconductor layer may be formed using single crystalline silicon, polycrystalline silicon, or oxide semiconductor. For example, when the semiconductor layer includes oxide semiconductor, the semiconductor layer is formed by a sputtering process using a plurality of targets.

The semiconductor layer may be etched to form an active pattern 610 in the display region 110 by a photolithography process or an etching process using a hard mask.

An gate insulation layer 620 may be formed on the buffer layer 200 to substantially cover the active pattern 610. For example, the gate insulation layer 620 is formed by a deposition process using a silicon compound such as silicon oxide, silicon nitride, and silicon oxy nitride, or metal oxide such as aluminum oxide, titanium oxide, and hafnium oxide. The gate insulation layer 620 may be formed in the display region 110 and the peripheral region 120.

A first wiring 20 and a second wiring 30 may be formed on the gate insulation layer 620. In example embodiments, the first and the second wirings 20 and 30 are formed in the peripheral region 120, and the second wiring 30 may be closer to the display region 110 than the first wiring 20. For example, the first and the second wirings 20 and 30 are formed using molybdenum and/or titanium. A gate electrode 630 may be formed on the gate insulation layer 620 in the display region 110. The gate electrode 630 may be formed on a top of the active pattern 610. For example, the gate electrode 630 is formed using molybdenum and/or titanium.

Impurities may be injected to the active pattern 610 by using the gate electrode 630 as an ion injection mask, and then a source region 612 and a drain region 616 may be formed on the active pattern 610, and a channel region 614 may be defined between the source region 612 and the drain region 616.

In example embodiments, the first and the second wirings 20 and 30, and the gate electrode 630 are simultaneously or concurrently formed. For example, a conductive layer is formed on the gate insulation layer 620 in the display region 110 and the peripheral region 120, and then the conductive layer is partially removed to simultaneously form the first and the second wirings 20 and 30, and the gate electrode 630. Therefore, an additional process to form the first and the second wirings 20 and 30 may be not required.

Figure 8:
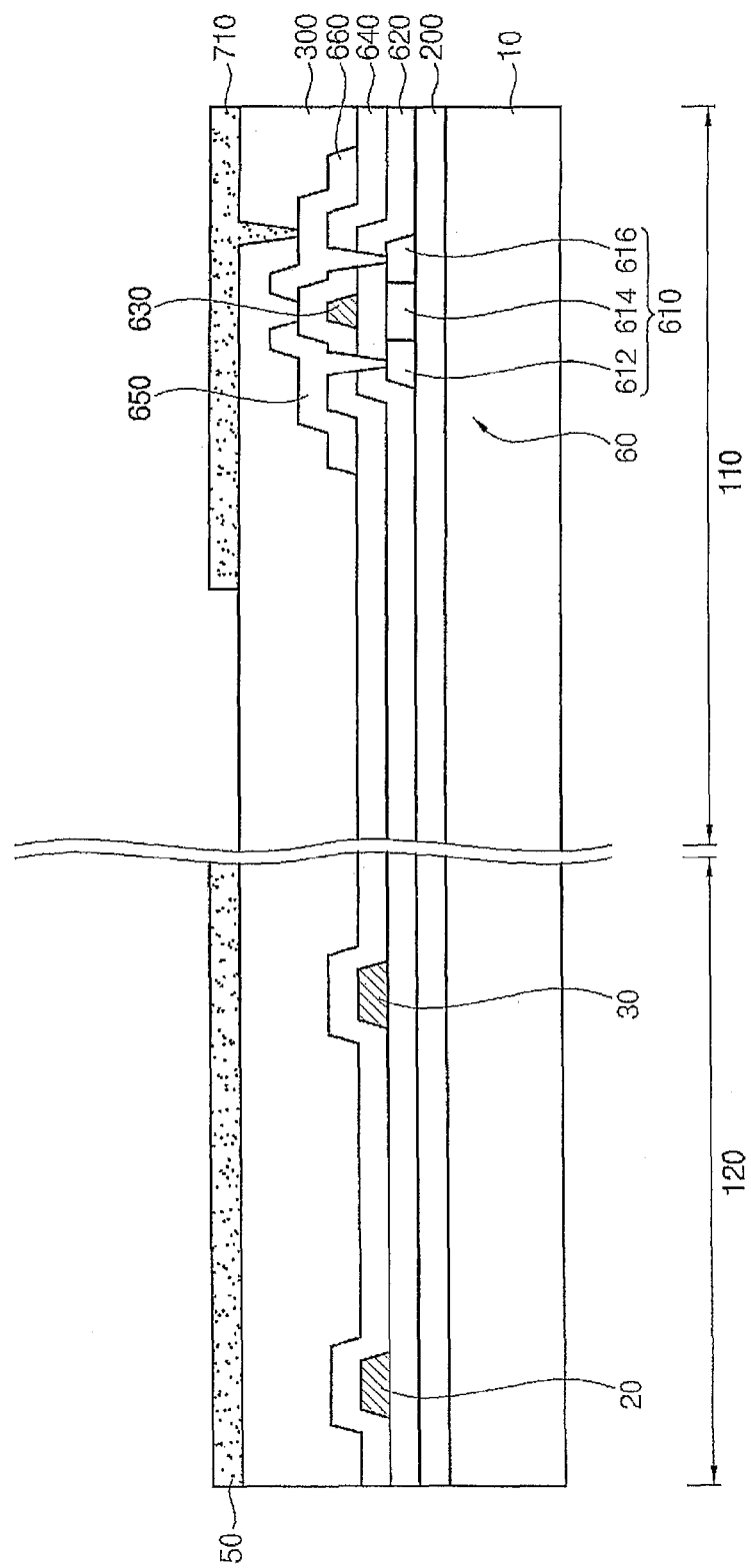

Referring to FIG. 8, an insulation interlayer 640 may be formed on the gate insulation layer 620 to substantially cover the gate electrode 630. For example, the insulation interlayer 640 is formed by a deposition process or a coating process using a silicon compound such as silicon oxide, silicon nitride, silicon oxy nitride, etc.

A source electrode 650 and a drain electrode 660 may be formed on the insulation interlayer 640. The source electrode 650 and the drain electrode 660 may be in contact with the source region 612 and drain region 616, respectively, through the gate insulation layer 620 and the insulation interlayer 640. For example, the source electrode 650 and the drain electrode 660 are formed using aluminum and/or copper.

An insulation layer 300 may be formed on the insulation interlayer 640 to substantially cover the source electrode 650 and the drain electrode 660. For example, the insulation layer 300 is formed by a deposition process or a coating process using a silicon compound such as silicon oxide, silicon nitride, silicon oxy nitride, etc. Alternatively, the insulation layer 300 may be formed on the insulation interlayer 640 using an organic material such as polyimide or acryl.

As illustrated in FIG. 8, a heat blocking layer 50 may be formed on the insulation layer 300. The heat blocking layer 50 may be formed in the peripheral region 120. The heat blocking layer 50 may substantially cover the first and the second wirings 20 and 30. For example, the heat blocking layer 50 is formed using silver and/or indium tin oxide.

A first electrode 710 may be formed on the insulation layer 300 in the display region 110. The first electrode 710 may contact the drain electrode 660 through the insulation layer 300. For example, the first electrode 710 is formed using silver and/or indium tin oxide.

In example embodiments, the heat blocking layer 50 and the first electrode 710 are simultaneously or concurrently formed. For example, an additional conductive layer is formed on the insulation layer 300, and then the additional conductive layer is partially removed to simultaneously form the heat blocking layer 50 and the first electrode 710. Therefore, an additional process for forming the heat blocking layer 50 may be not required.

Figure 9:
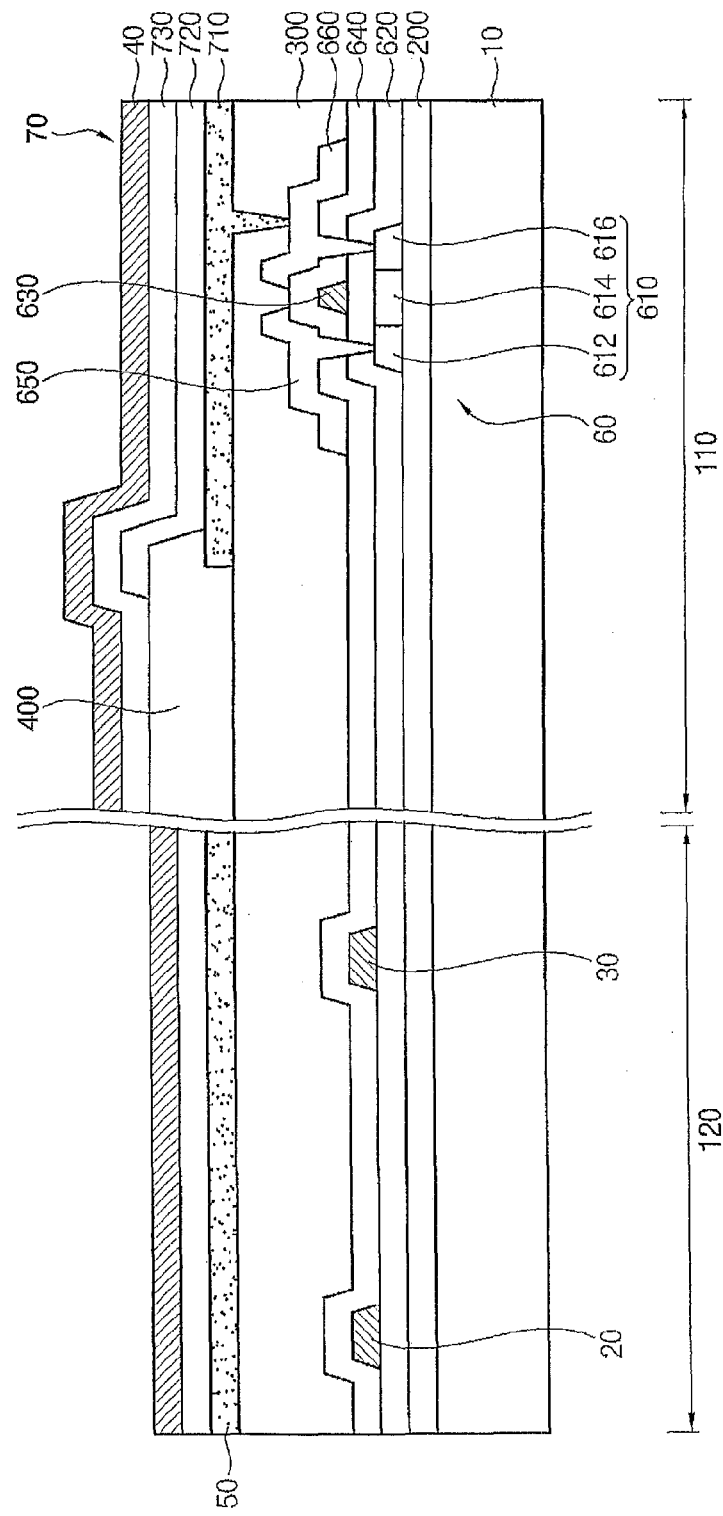

Referring to FIG. 9, a pixel defining layer 400 may be formed on the insulation layer 300 to partially expose the first electrode 710. The pixel defining layer 400 may be formed in the display region 110 and the peripheral region 120. For example, the pixel defining layer 400 is formed using an organic material or an inorganic material.

An organic light-emitting layer 720 may be formed on the exposed first electrode 710 and a portion of the pixel defining layer 400. When the organic light-emitting layer 720 is formed using an organic material having a relatively low molecular weight, a hole injection layer and a hole transport layer may be formed on the first electrode 710 and the pixel defining layer 400 before forming the organic light-emitting layer 720, and an electron transport layer and an electron injection layer may be formed after forming the organic light-emitting layer 720. When the organic light-emitting layer 720 is formed using an organic material having a relatively high molecular weight, a hole transport layer may be formed on the first electrode 710 and the pixel defining layer 400 before forming the organic light-emitting layer 720.

A second electrode 730 may be formed on the organic light-emitting layer 720. The second electrode 730 may be formed in the display region 110 and the peripheral region 120. For example, the second electrode 730 is formed using silver and/or indium tin oxide.

As illustrated in FIG. 9, an encapsulation layer 40 may be formed on the second electrode 730. The encapsulation layer 40 may be formed in the display region 110 and the peripheral region 120. At least one organic film and at least one inorganic film may be stacked on the second electrode 730 to form the encapsulation layer 40. In example embodiments, a first inorganic film, an organic film, and a second inorganic film are stacked on the second electrode 730 to form the encapsulation layer 40. For example, the organic film is formed using at least one of epoxy, polyimide (PI), polyethylene terephthalate (PET), polycarbonate (PC), polyethylene (PE), and polyacrylate, and the inorganic film may be formed using at least one of aluminum oxide (AlOx), silicon oxide (SiOx), silicon nitride (SiNx), silicon oxy nitride (SiOxNy), silicon carbide (SiCx), titanium oxide (TiOx), zirconium oxide (ZrOx), and zinc oxide (ZnOx).

Figure 10:
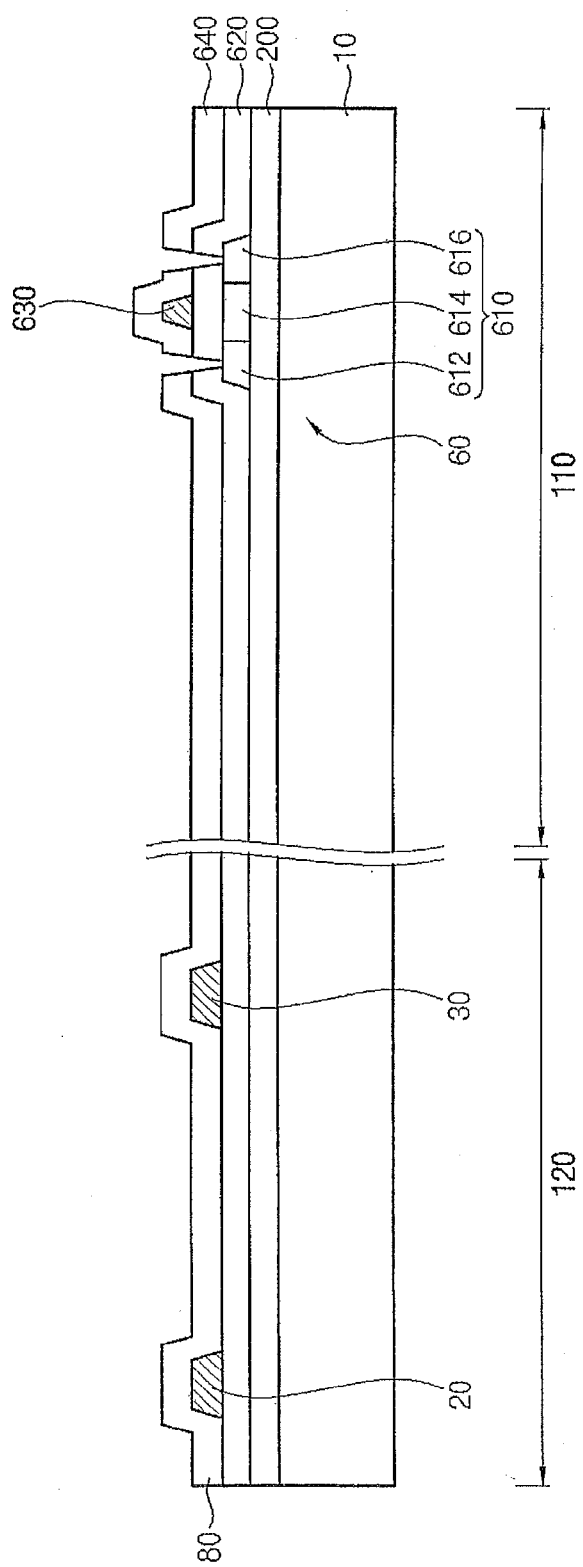
FIGS. 10 to 12 are cross-sectional views illustrating a method of manufacturing the OLED device in accordance with some example embodiments.
Figure 11:
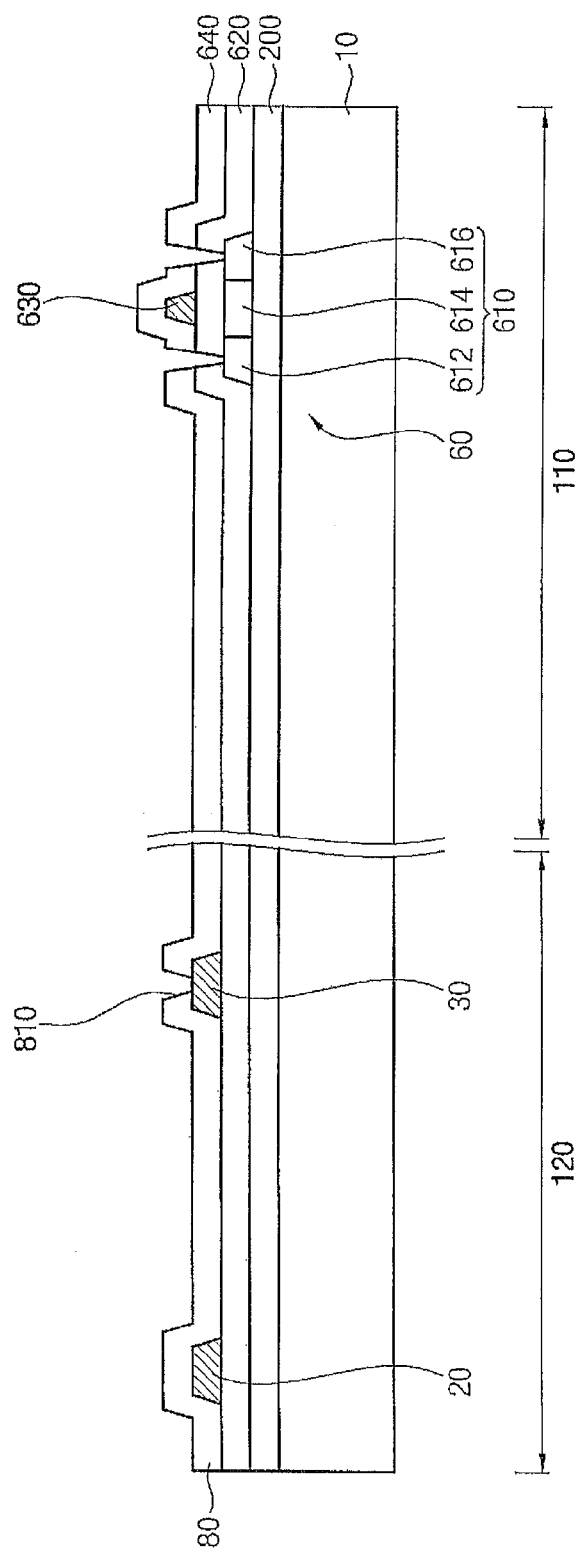
Figure 12:
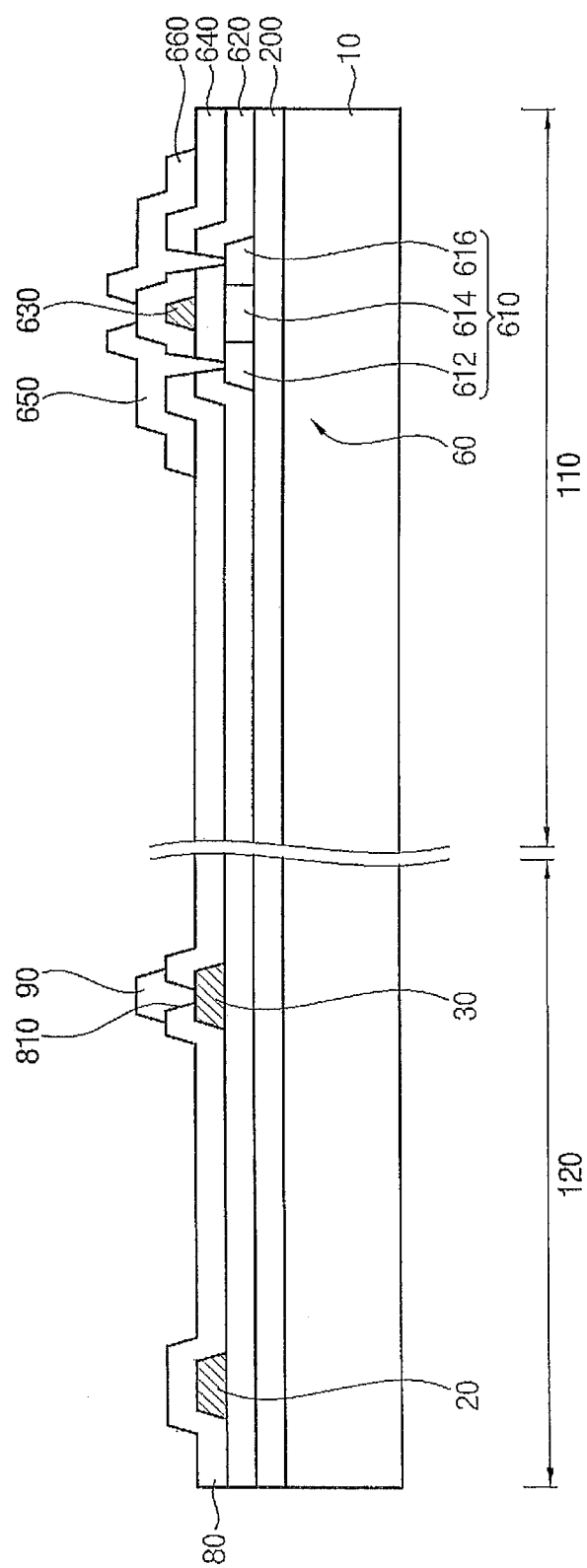

FIGS. 10 to 12 are cross-sectional views illustrating a method of manufacturing the OLED device in accordance with some example embodiments.

Detailed description about elements in FIGS. 10 to 12 which are substantially the same as or similar to those illustrated with reference to FIGS. 6 and 9 will be omitted.

Referring to FIG. 10, the insulation interlayer 640 may be formed in the display region 110, and the additional insulation layer 80 may be formed in the peripheral region 120 to substantially cover the first and the second wirings 20 and 30, simultaneously.

The additional insulation layer 80 may be formed on the gate insulation layer 620 in the peripheral region 120. For example, the additional insulation layer 80 is formed by a deposition process or a coating process using a silicon compound such as silicon oxide, silicon nitride, silicon oxy nitride, etc.

In example embodiments, the additional insulation layer 80 and the insulation interlayer 640 are the same layer. Furthermore, the insulation interlayer 640 may extend from the display region 110 to the peripheral region 120, and may correspond to the additional insulation layer 80 in the peripheral region 120 to substantially cover the first and the second wirings 20 and 30. Therefore, an additional process to form the additional insulation layer 80 may be not required.

Referring to FIG. 11, the additional insulation layer 80 may be partially removed to form a contact hole 810 that exposes a portion of the second wiring 30. For example, the contact hole 810 formed by a laser drilling process.

Referring to FIG. 12, the contact hole 810 may be filled to form a third wiring 90 on the additional insulation layer 80. For example, the third wiring 90 is formed using aluminum and/or copper. The source electrode 650 and the drain electrode 660 are formed on the insulation interlayer 640 in the display region 110.

In example embodiments, the third wiring 90, and the source electrode 650 and the drain electrode 660 are simultaneously formed. For example, a conductive layer is formed on the additional insulation layer 80 and the insulation interlayer 640, and then the conductive layer may be patterned to simultaneously form the third wiring 90 in the peripheral region 120, and the source electrode 650 and the drain electrode 660 in the display region 110. Therefore, an additional process to form the third wiring 90 may be not required.

Although example embodiments of the OLED devices and the methods of manufacturing the OLED devices have been described with reference to the figures, those skilled in the art will readily appreciate that many modifications are possible in the example embodiments without materially departing from the novel teachings and advantages of the present inventive concept.

The described technology can be applied to any electronic device including an OLED device. For example, the described technology can be applied to display devices for computers, notebooks, cellular phones, smart phones, smart pads, portable media players (PMPs), personal digital assistances (PDAs), MP3 players, digital cameras, video camcorders, etc.

The foregoing is illustrative of example embodiments and is not to be construed as limiting thereof. Although the inventive technology has been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light-emitting display (OLED) device, comprising:
    a substrate having a display region and a peripheral region;
    a transistor disposed in the display region, the transistor including an active pattern, a gate insulation layer, a gate electrode, a source electrode, and a drain electrode;
    an organic light-emitting structure disposed in the display region and electrically connected to the transistor, the organic light-emitting structure including a first electrode, an organic light-emitting layer, and a second electrode;
    a first wiring and a second wiring disposed in the peripheral region;
    an encapsulation layer disposed over the first and second wirings and the organic light-emitting structure; and
    a heat blocking layer disposed between the first and the second wirings and the encapsulation layer to block a heat generated from the first and the second wirings,
    wherein the heat blocking layer and the first electrode are disposed on the same layer.

2. The OLED device of claim 1, wherein the first and second wirings are disposed on the same layer.

3. The OLED device of claim 1, wherein each of the first and the second wirings is configured to transfer an aging signal to a pixel of the OLED device.

4. The OLED device of claim 1, wherein the first wiring is configured to transfer a red data signal or a blue data signal to a pixel of the OLED device, and wherein the second wiring is configured to transfer a green data signal to a pixel of the OLED device.

5. The OLED device of claim 1, wherein each of the first and the second wirings includes at least one of molybdenum (Mo) and titanium (Ti).

6. The OLED device of claim 1, wherein the encapsulation layer includes at least one organic film and at least one inorganic film.

7. The OLED device of claim 1, wherein the encapsulation layer has a stacked structure including a first inorganic film, an organic film, and a second inorganic film.

8. The OLED device of claim 1, wherein the heat blocking layer includes at least one of silver (Ag) and indium tin oxide (ITO).

9. The OLED device of claim 1, wherein the first and second wirings and the gate electrode are disposed on the same layer.

10. The OLED device of claim 1, further comprising:
an additional insulation layer disposed over the first and the second wirings in the peripheral region; and
a third wiring disposed over the additional insulation layer.

11. The OLED device of claim 10, wherein the additional insulation layer has a contact hole exposing the second wiring, and wherein the third wiring contacts the second wiring through the contact hole.

12. The OLED device of claim 10, wherein the third wiring includes at least one of aluminum (Al) and copper (Cu).

13. The OLED device of claim 10, wherein the third wiring has a resistance less than that of the second wiring.

14. The OLED device of claim 10, wherein the third wiring, the source electrode, and the drain electrode are disposed on the same layer.

15. A method of manufacturing an organic light-emitting display (OLED) device, comprising:

providing a substrate including a display region and a peripheral region;

forming a transistor in the display region, the transistor including an active pattern, a gate insulation layer, a gate electrode, a source electrode, and a drain electrode;

forming an organic light-emitting structure in the display region, the organic light-emitting structure being electrically connected to the transistor and including a first electrode, an organic light-emitting layer, and a second electrode;

forming a first wiring and a second wiring in the peripheral region;

forming a heat blocking layer to cover the first and the second wirings in the peripheral region; and forming an encapsulation layer over the heat blocking layer and the organic light-emitting structure, wherein the heat blocking layer and the first electrode are simultaneously formed.

16. The method of claim 15, wherein the first and second wirings and the gate electrode are simultaneously formed.

17. The method of claim 15, further comprising:
forming an additional insulation layer over the first and the second wirings in the peripheral region;
partially removing the additional insulation layer to form a contact hole exposing the second wiring; and
forming a third wiring over the additional insulation layer while filling the contact hole.

18. The method of claim 17, wherein the third wiring, the source electrode, and the drain electrode are simultaneously formed.

* * * * *